United States Patent
Lee et al.

(10) Patent No.: US 7,202,522 B2
(45) Date of Patent: Apr. 10, 2007

(54) ERASABLE AND PROGRAMMABLE READ ONLY MEMORY (EPROM) CELL OF AN EPROM DEVICE AND METHOD OF MANUFACTURING A SEMICONDUCTOR DEVICE HAVING THE EPROM CELL

(75) Inventors: Ki-Hyung Lee, Suwon-si (KR); Seung-Han Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 85 days.

(21) Appl. No.: 10/973,894

(22) Filed: Oct. 26, 2004

(65) Prior Publication Data

US 2005/0093079 A1    May 5, 2005

(30) Foreign Application Priority Data

Nov. 1, 2003   (KR) .................... 10-2003-0077188

(51) Int. Cl.
*H01L 21/70* (2006.01)
(52) U.S. Cl. .................. 257/314; 257/E21.683
(58) Field of Classification Search ................ 257/314, 257/E21.68, E21.683, E21.684
See application file for complete search history.

(56) References Cited

U.S. PATENT DOCUMENTS 6,258,667 B1 *   7/2001   Huang ................... 438/258
6,420,752 B1 *   7/2002   Ngo et al. ............... 257/315
2002/0008275 A1 *   1/2002   Nakagawa .............. 257/314

FOREIGN PATENT DOCUMENTS

| JP | 02-231899 | 8/2002 |
| KR | 99-021893 | 3/1999 |
| KR | 01-015540 | 2/2001 |
| KR | 1020010038359 | 5/2001 |

* cited by examiner

*Primary Examiner*—Thomas L. Dickey
(74) *Attorney, Agent, or Firm*—F. Chau & Associates

(57) ABSTRACT

Provided is an erasable and programmable read only memory (EPROM) device in which a plasma enhanced oxide (PEOX) film covers an upper surface of a floating gate in a single poly one time programmable (OTP) cell and a method of manufacturing a semiconductor device having the same. The semiconductor device comprises a substrate having an OTP cell region, on which a floating gate is formed for making an OTP cell transistor, and a main chip region, on which a gate of a transistor is formed. A PEOX film is formed on the OTP cell region and the main chip region. The PEOX film covers the floating gate in a close state and covers the gate by a predetermined distance. A silicon oxy nitride (SiON) film is interposed between the gate and the PEOX film in the main chip region.

7 Claims, 8 Drawing Sheets

ERASABLE AND PROGRAMMABLE READ ONLY MEMORY (EPROM) CELL OF AN EPROM DEVICE AND METHOD OF MANUFACTURING A SEMICONDUCTOR DEVICE HAVING THE EPROM CELL

This application claims priority to Korean Patent Application No. 2003-77188 filed on Nov. 1, 2003 in the Korean Intellectual Property Office, the disclosure of which is incorporated herein in its entirety by reference.

BACKGROUND OF THE INVENTION

1. Field of the Invention

The present invention relates to a semiconductor device and a method of manufacturing the same, and more particularly, to an erasable and programmable read only memory (EPROM) device for a single poly one time programmable (OTP) cell and a method of manufacturing a semiconductor device having the same.

2. Description of the Related Art

An EPROM is widely used in a variety of logic devices because it can electrically store and erase data, and it can retain data when power is turned off. The EPROM is a core device of a micro controller unit for controlling equipment such as a central processing unit (CPU) and remote controllers for household appliances like televisions (TVs), video, or audio devices.

An OTP cell product, which is a type of EPROM, can be developed in a short period of time by coding program data on the OTP cell directly by a user, and mass produced as a version of a mask ROM after making the product applicable to a nonvolatile memory device. An integrated circuit having a single poly OTP cell with a complete insulating gate is widely used as an EPROM transistor. A variety of technologies related to this device have been developed as disclosed, for example, in the following: WO 1999/17750, U.S. Pat. Nos. 6,399,442 and 6,421,293.

Data on a single poly OTP cell can be erased by an ultraviolet (UV) light, and one time programming by a user is possible. Therefore, it is essential to secure a cell data retention characteristic for storing data semi-permanently after one time programming by a user. Generally, the cell data retention characteristic in a single poly OTP depends on a material of an interlayer insulating film.

FIG. 1 is a cross-sectional view of a conventional single poly OTP cell used for an LDI (LCD driver IC) product. Referring to FIG. 1, a conventional single poly OTP cell 10 comprises a source region 16 and a drain region 18 separately formed on a semiconductor substrate 12. A channel region 20 is defined between the source region 16 and the drain region 18. A gate oxide film 22 is formed on the channel region 20, and a floating gate 30 is formed on the gate oxide film 22. Insulating spacers 32 are formed on both sidewalls of the floating gate 30.

The floating gate 30 and the insulating spacers 32 are completely covered by an interlayer insulating film 40, and the floating gate 30 is completely insulated by surrounding insulating films. The interlayer insulating film 40 that covers the floating gate 30 includes a silicon oxy nitride (SiON) film 42 adjacent to the floating gate 30, a high density plasma (HDP) insulating film 44, and a plasma-enhanced tetraethoxysilane (P-TEOS) insulating film 47, which are sequentially deposited.

In a conventional single poly OTP cell configuration in which the SiON film 42, the lowest insulating film of the interlayer insulating film 40, directly covers the floating gate 30, the SiON film is the main cause of leakage of charged electrons from the single poly OTP cell. That is, electrons charged in the floating gate 30, by initial programming, leak over time into the SiON film 42 that covers the floating gate 30, thereby causing a low program threshold voltage. This results in a weakening of the data retention characteristic of the OTP cell.

The data retention characteristic of the single poly OTP cell can be increased by adopting an insulating film material other than the SiON film 42. However, it is difficult to find a substitutable film material, which can secure a hot carrier injection (HCI) characteristic and an insulating characteristic required for forming a transistor in a main chip region, and that is formed at the same level as the SiON film on the substrate except the OTP cell region.

SUMMARY OF THE INVENTION

The present invention provides an erasable and programmable read only memory (EPROM) device that improves a data retention characteristic of a single poly one time programmable (OTP) cell by preventing leakage of charged electrons from a floating gate. The present invention also provides a semiconductor device having a structure that improves the data retention characteristic in a single poly OTP cell region and secures a hot carrier injection (HCI) characteristic and an insulating characteristic required for forming a transistor in a main chip region. The present invention further provides a method of manufacturing a semiconductor device having a structure that improves the data retention characteristic in a single poly OTP cell region and secures the HCI characteristic and the insulating characteristic required for forming a transistor in a main chip region.

According to an aspect of the present invention, an EPROM comprises a floating gate formed on a gate insulating film on a semiconductor substrate, insulating spacers that cover sidewalls of the floating gate, and a plasma enhanced oxide (PEOX) film formed on the floating gate and the insulating spacers. The floating gate is a single layer formed of doped polysilicon. The PEOX film has a thickness in a range of 500~1,000 Å.

The EPROM device according to the present invention further comprises an interlayer insulating film formed on the floating gate, and the PEOX. The interlayer insulating film comprises one of a high density plasma (HDP) film, a plasma-enhanced tetraethoxysilane (P-TEOS) film, and a phosphosilicate glass (PSG) film. The insulating spacers are formed of a silicon nitride film or a combination of a nitride film and an oxide film.

According to another aspect of the present invention, a semiconductor device according to the present invention comprises a semiconductor substrate having an OTP cell region and a main chip region. A floating gate of an OTP cell transistor in the OTP cell region is formed on a first gate insulating film. Sidewalls of the floating gate are covered by first insulating spacers. A gate of a transistor is formed on a second gate insulating film in the main chip region of the substrate. Sidewalls of the gate are covered by second insulating spacers. A PEOX film covers the floating gate and the first insulating spacers in a close state, and covers the gate and the second insulating spacer by a predetermined distance. A SiON film is interposed between the gate and the PEOX film in the main chip region.

According to yet another aspect of the present invention, a method of manufacturing a semiconductor device comprises forming a gate insulating film on a OTP cell region on a semiconductor substrate, forming a floating gate on the gate insulating film, forming first insulating spacers covering sidewalls of the floating gate, forming source/drain regions on sides of the floating gate on the substrate, forming a PEOX film that covers the floating gate and the first insulating spacers, and forming an interlayer insulating film on the PEOX film.

The semiconductor substrate comprises a main chip region near the OTP cell region. A method of manufacturing a semiconductor device according to the present invention comprises forming a gate of a transistor in a main chip region and forming second insulating spacers that cover sidewalls of the gate after forming the first insulating spacers in the main chip region, and forming a SiON film pattern that covers the gate and the second insulating spacers in a remainder of the region except the floating gate and an area surrounding the floating gate after forming the source/drain regions before forming the PEOX film.

When forming a SiON film pattern, a SiON film is formed that covers the floating gate and the first insulating spacers in the OTP region and that covers the gate and the second insulating spacers in the main chip region. Afterward, a portion of the SiON film is removed to expose the floating gate and the first insulating spacers in the OTP region.

DETAILED DESCRIPTION OF THE INVENTION

FIGS. 2 through 5 are cross-sectional views for describing a method of manufacturing a single poly one time programmable (OTP) cell of an erasable and programmable read only memory (EPROM) device, according to a preferred embodiment of the present invention.

Figure 1:
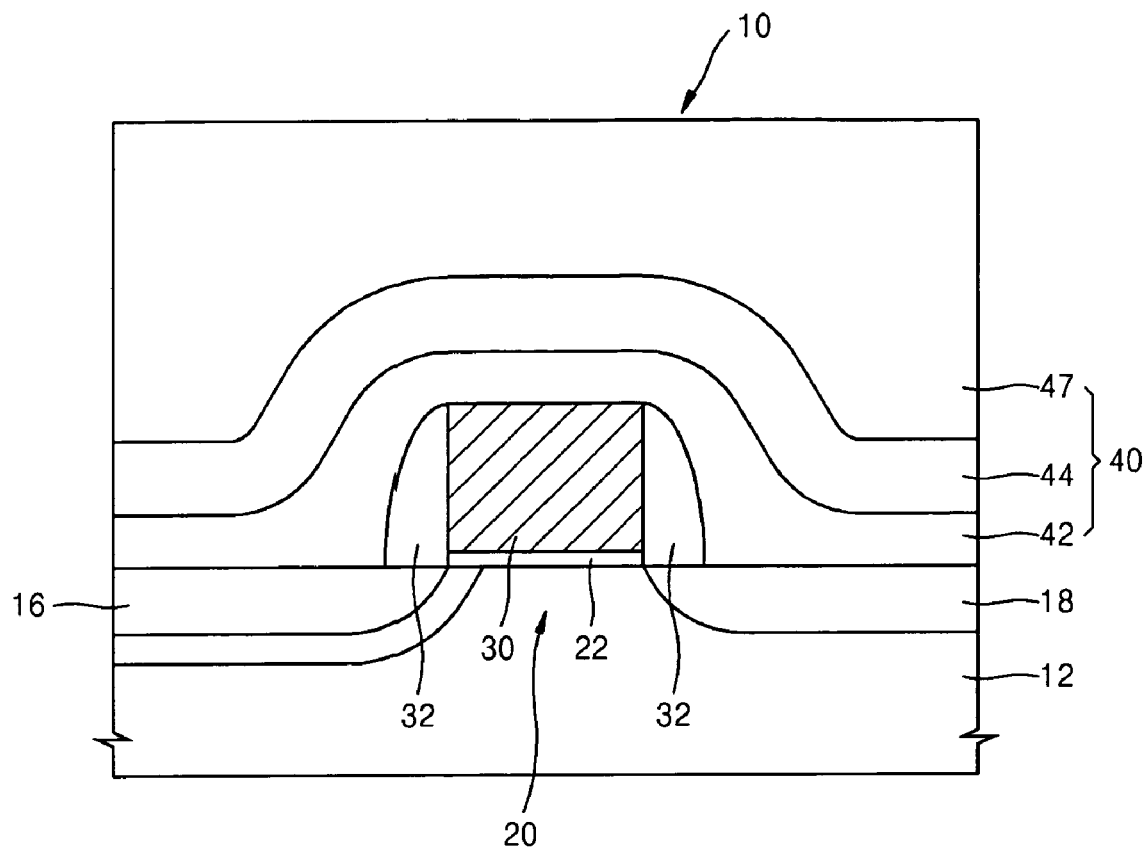
FIG. 1 is a cross-sectional view showing a configuration of a conventional single poly one time programmable (OTP) cell.
Figure 2:
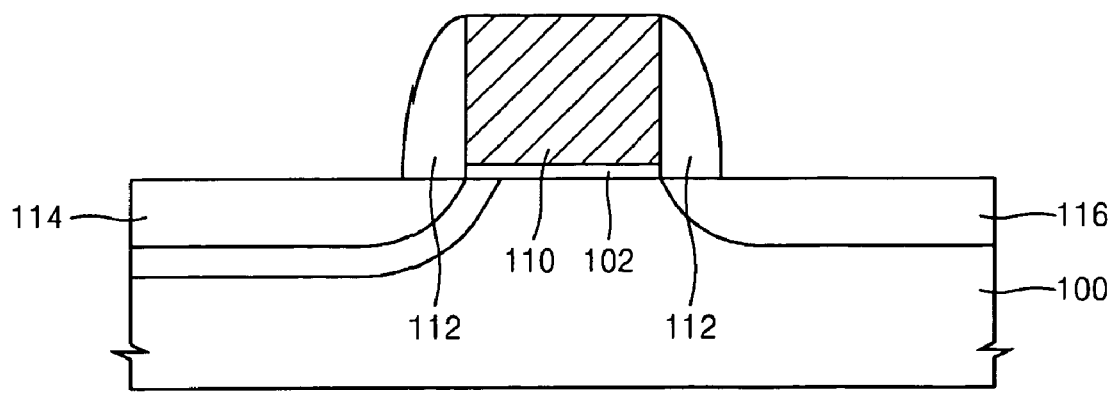
FIGS. 2 through 5 are cross-sectional views for describing a method of manufacturing a single poly OTP cell of an erasable and programmable read only memory (EPROM) device, according to a preferred embodiment of the present invention.

Referring to FIG. 2, after defining active regions on a semiconductor substrate 100 by a device isolation process, a gate oxide film 102 with a thickness of approximately 140Å is formed on an OTP cell region of an active region on the substrate 100. After forming a conductive layer such as a doped polysilicon layer on the gate oxide film 102, a floating gate 110 is formed by patterning the conductive layer. After depositing an insulating film covering the entire surface of the floating gate 110, insulating spacers 112 covering sidewalls of the floating gate 110 are formed by etching back the insulating film. The insulating spacers can be formed, for example, of silicon nitride. Alternatively, the spacers can be formed of a combination of a nitride film and an oxide film, such as a combination of silicon nitride film and a medium temperature oxide (MTO) film. Next, a source region 114 and a drain region 116 on both sides of the floating gate 110 are formed on the substrate 100.

Figure 3:
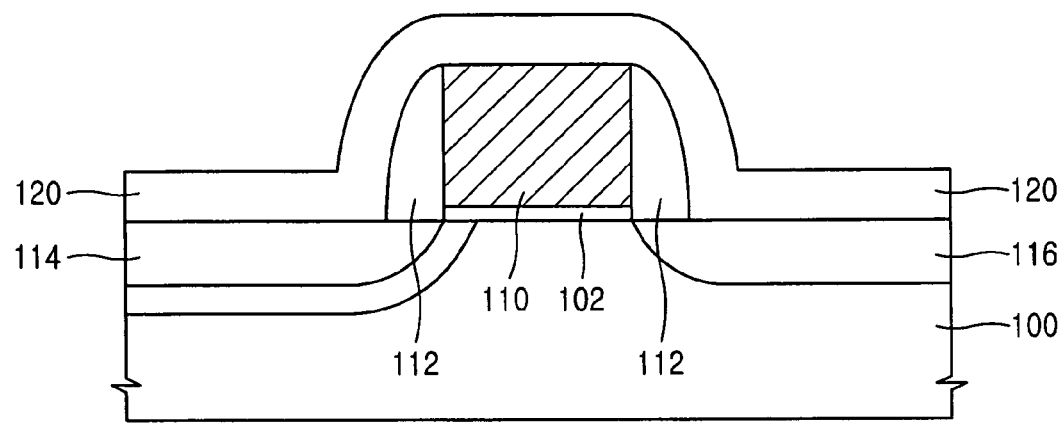

Referring to FIG. 3, a plasma enhanced oxide (PEOX) film 120 with a thickness in a range of 500~1,000 Å, preferably approximately 600~800 Å, is formed covering the floating gate 110, the insulating spacers 112, the source region 114, and the drain region 116. The PEOX film 120 adjacent to the floating gate 110 constitutes the lowest film of the interlayer insulating film formed on the floating fate 110.

Figure 4:
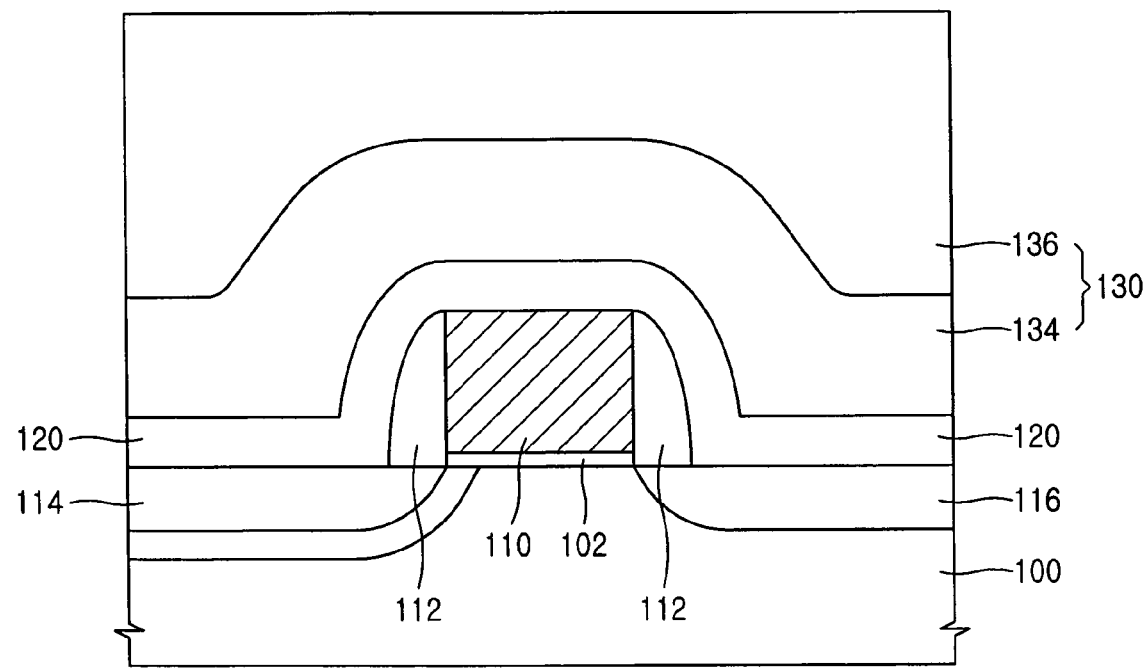

Referring to FIG. 4, an interlayer insulating film 130 is formed by depositing an insulating material on the PEOX film 120. The interlayer insulating film 130, formed directly above the PEOX film 120, can be a combination of a first insulating film 134 and a second insulating film 136 sequentially formed on the PEOX film 120.

The first insulating film 134 can be formed of a high density plasma (HDP) insulating film having a thickness of approximately 5,000 Å, and the second insulating film 136 can be formed of a plasma-enhanced tetraethoxysilane (P-TEOS) insulating film having a thickness of approximately 11,000 Å. A phosphosilicate glass (PSG) film (not shown) having a thickness of approximately 3,000 Å can be further formed between the PEOX film 120 and the first insulating film 134, which is formed of an HDP insulating film, to increase a gap filling characteristic of the interlayer insulating film 130. When the PSG film with a thickness of approximately 3,000 Å is additionally formed between the PEOX film 120 and the first insulating film 134, the thickness of the P-TEOS insulating film constituting the second insulating film 136 can be reduced to approximately 8,000 Å. Preferably, the PSG film is formed by an atmospheric chemical vapor deposition (APCVD) method.

In another preferable example for forming the interlayer insulating film 130, the first insulating film 134 is formed of a PSG film by the APCVD method and the second insulating film 136 is formed of a P-TEOS insulating film.

After forming the second insulating film 136, an upper surface of the interlayer insulating film 130 is flattened by using a chemical mechanical polishing (CMP) process.

Figure 5:
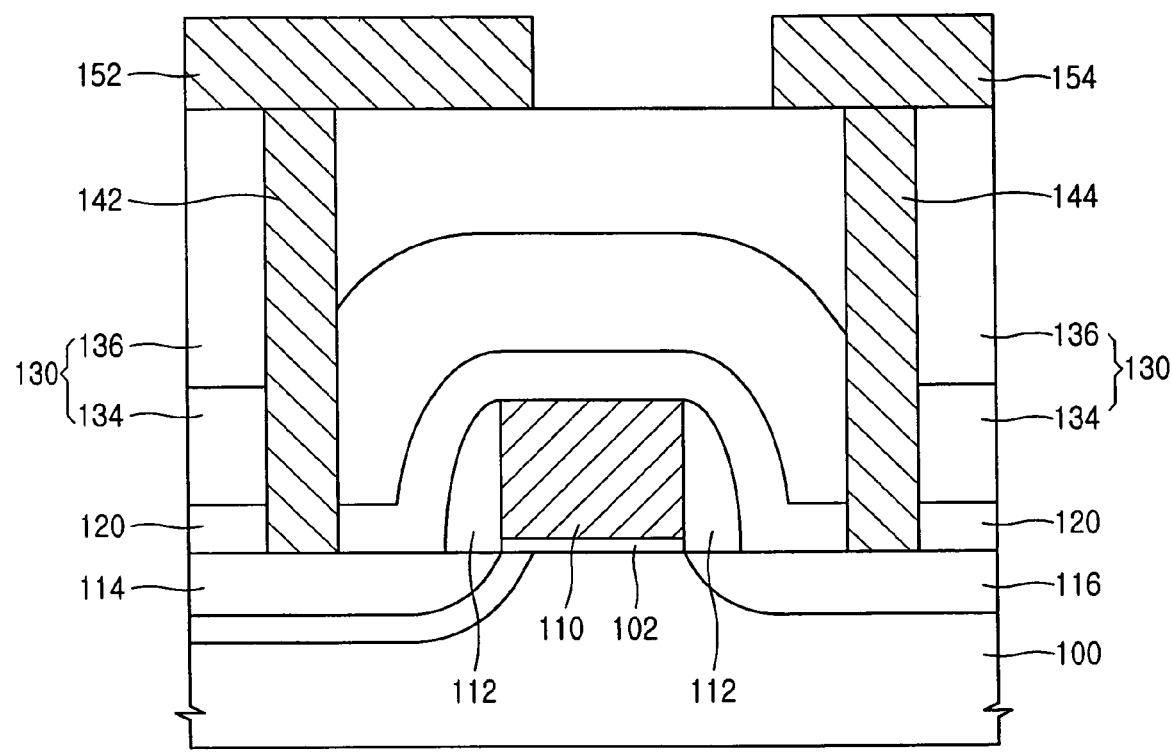

Referring to FIG. 5, contact holes exposing contact portions on the source region 114 and the drain region 116 are formed by patterning the interlayer insulating film 130 and the PEOX film 120, contact plugs 142 and 144 are formed by filling the contact holes with a conductive material such as a metal, and wiring layers 152 and 154 for electrical connection to the contact plugs 142 and 144 are formed on the interlayer insulating film 130.

In a single poly OTP cell according to the present invention, the lowest insulating film, formed directly above the floating gate 110 of the interlayer insulating film 130 is formed of a PEOX film 120. Accordingly, the program threshold voltage is not lowered because the leakage of the charged electrons from the floating gate 110 into the insulating film is prevented by the insulating characteristic of the PEOX film, thereby improving the data retention characteristic of the OTP cell transistor.

FIGS. 6 through 11 are cross-sectional views for describing a method of manufacturing a semiconductor device, according to an embodiment of the present invention.

Figure 6:
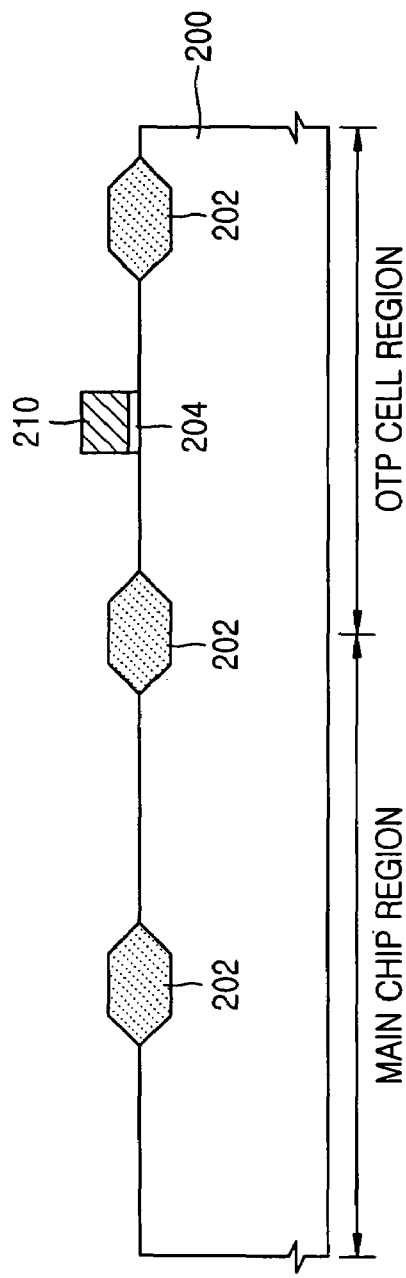
FIGS. 6 through 13 are cross-sectional views for describing a method of manufacturing a semiconductor device, according to a preferred embodiment of the present invention.

Referring to FIG. 6, a substrate 200 having an OTP cell region (hereinafter referred to as, "the OTP region") for forming a single poly OTP cell and a main chip transistor region (hereinafter referred to as, "the main chip region") for forming transistors constituting a main chip, such as a high voltage (HV) or a low voltage (LV) device is prepared. An active region is defined by forming device isolation regions 202 by a poly-spacer local oxidation of silicon (PSL) on the substrate 200. A first gate insulating film 204 having a thickness of approximately 140 Å and a floating gate 210 having a thickness of approximately 2,000 Å deposited on the first gate insulating film 204 are formed in the OTP region of the substrate 200.

Figure 7:
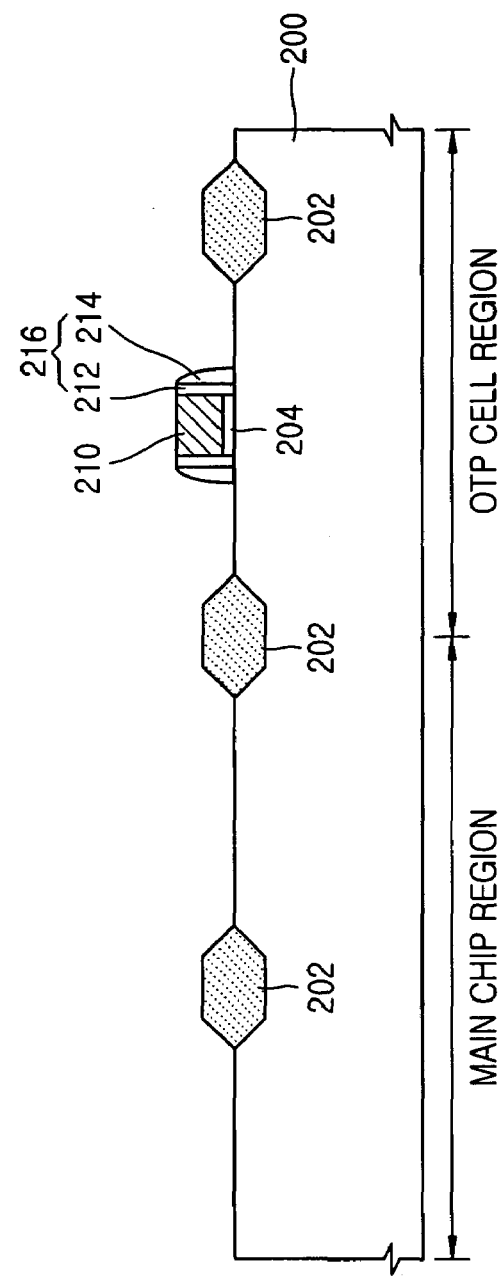

Referring to FIG. 7, an MTO film 212 having a thickness of approximately 150 Å is formed on the resulting product having the floating gate 210, a silicon nitride film 214 having a thickness of approximately 1,250 Å is formed on the MTO film 212, first insulating spacers 216 comprising the MTO film and the silicon nitride film 214 are formed on the sidewalls of the floating gate 210 by back etching the MTO film 212 and the silicon nitride film 214. A portion of the MTO film 212 could remain on an upper face of the floating gate 210 after forming the first insulating spacers 216. In this case, the thickness of the remaining MTO film 212 is of at most a few tens of an Å, which negligibly affects the characteristics of the transistor.

Figure 8:
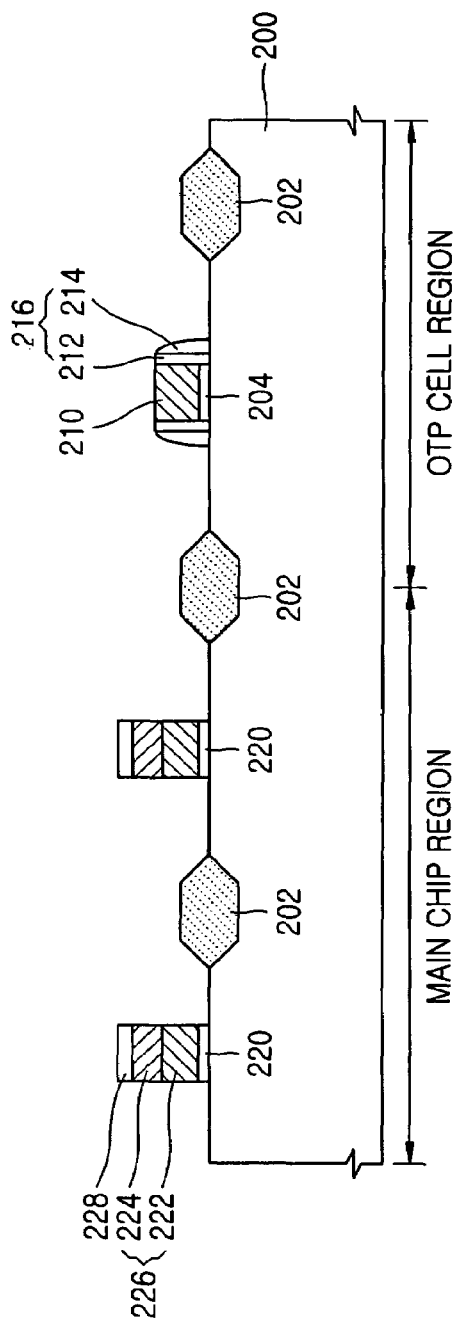

Referring to FIG. 8, a gate 226 sequentially stacked of a second gate insulating film 220, a doped polysilicon film 222 having a thickness of approximately 2,000 Å formed on the second gate insulating film 220, and a metal silicide film 224 such as a tungsten silicide film having a thickness of approximately 1,000 Å is formed for making a transistor required for a desired device on the main chip region of the substrate 200. A hard mask layer 228 formed of PEOX can be used as a mask for patterning the gate 226. The gate 226 can constitute a high voltage transistor.

Figure 9:
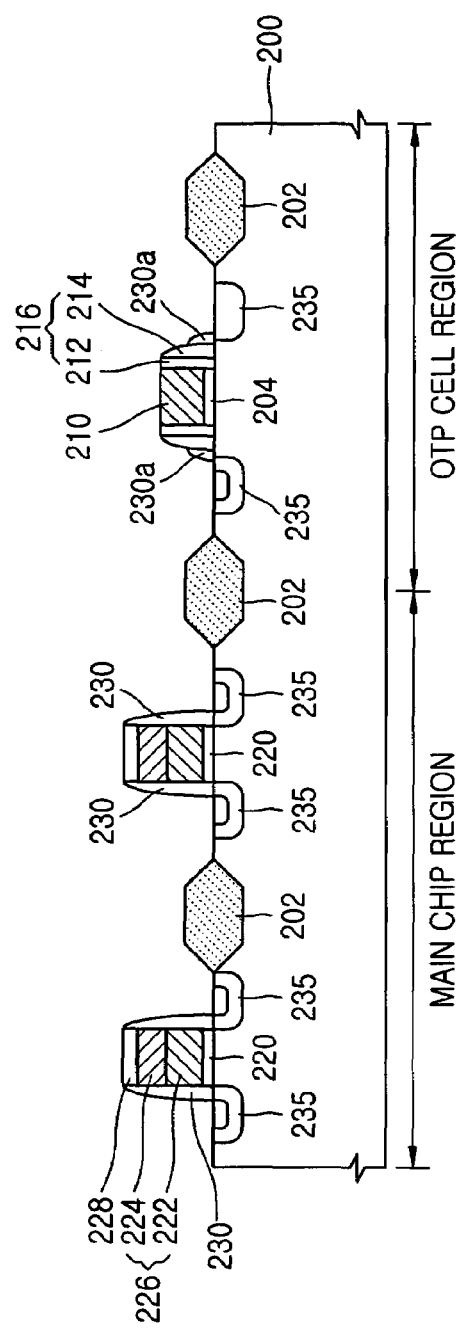

Referring to FIG. 9, after forming a source/drain region 235 in the OTP region, a high temperature oxide (HTO) film with a thickness of approximately 1,500 Å is formed on a resultant product having the gate 226, and then, second insulating spacers 230 on the sidewalls of the floating gate 210 are formed by etching back the HTO film. At this time, a residue layer 230a of the second insulating spacer 230 could remain on the walls of the first insulating spacer 216. Thereafter, the source/drain regions 235 are formed on the main chip region by an ionic implantation process.

Figure 10:
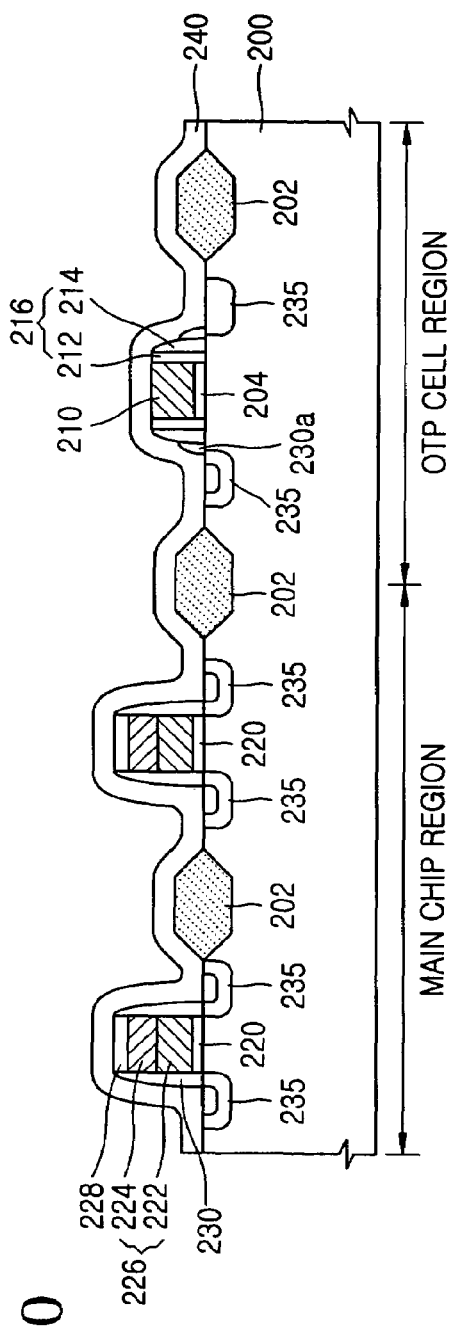

Referring to FIG. 10, a SiON film 240 with a thickness in a range of 500~1,000 Å, preferably 600 Å, is formed on the entire surface of the substrate 200. The SiON film 240 is advantageous for securing HCl and insulation characteristics required for forming a transistor on the main chip region.

Figure 11:
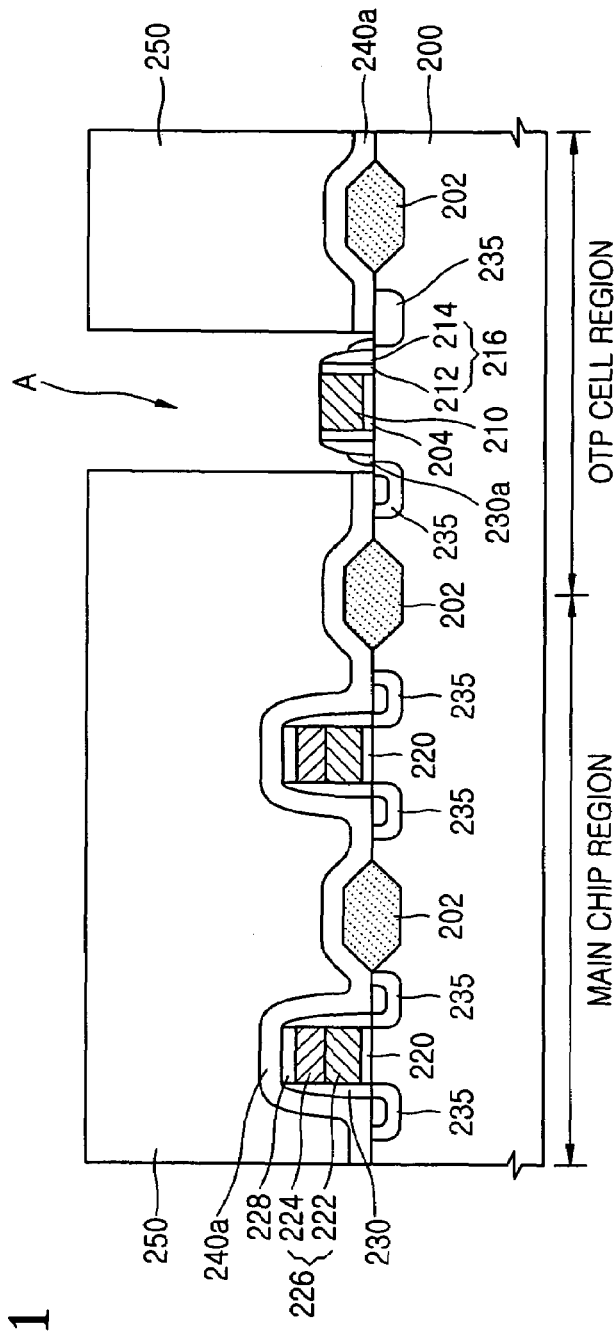

Referring to FIG. 11, a photo-resist pattern 250 for exposing the SiON film 240 in a predetermined region A including the floating gate 210 and surrounding area thereof is formed on the OTP region. Afterward, a SiON film pattern 240a is formed by selective dry etching an exposed portion of the SiON film 240 using the photo-resist pattern 250 as an etch mask. Accordingly, the SiON film 240 is only removed from a portion of the OTP region but the remaining regions are covered by the SiON film pattern 240a. The remaining portion of the SiON film pattern 240a assures the HCl characteristic and insulating characteristic required for forming the transistor on the main chip region by the SiON film pattern 240a covering the gate 226, and at the same time prevents charged electrons from leaking from the floating gate 210 on the OTP region.

Figure 12:
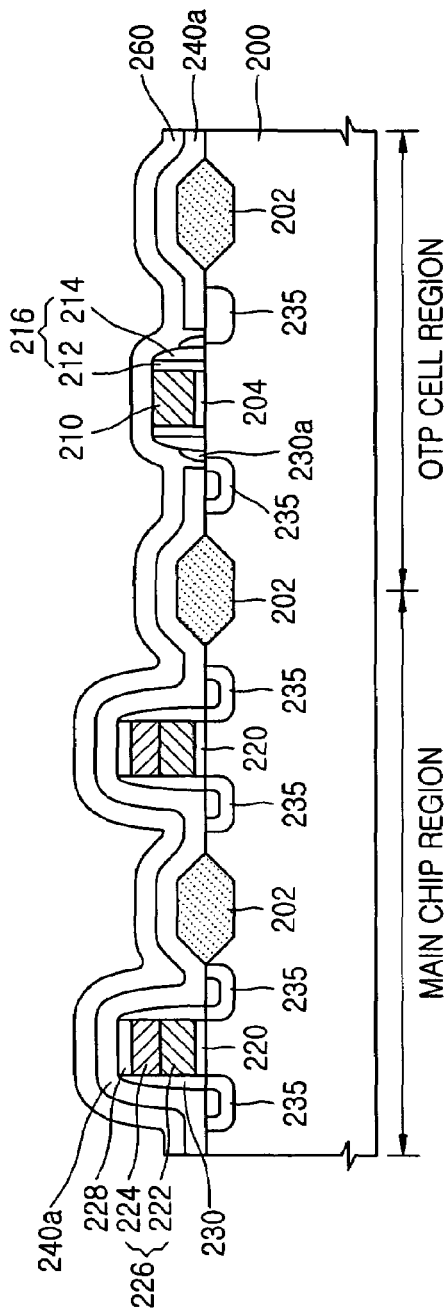

Referring to FIG. 12, after exposing an upper face of the SiON film pattern 240a by removing the photo-resist pattern 250, there is a PEOX film 260 with a thickness in a range of 500~1,000 Å, preferably approximately 600 Å covering the entire surface of the substrate 200 including an upper face of the floating gate 210 on the OTP region and the upper face of the SiON film pattern 240a. The PEOX film 260 is formed on the both OTP region and the main chip region. In this case, the PEOX film 260 covers the gate 210 and the first insulating spacers 216 in a close state and covers the gate 226 and the second insulating spacer 230 by a predetermined distance.

Figure 13:
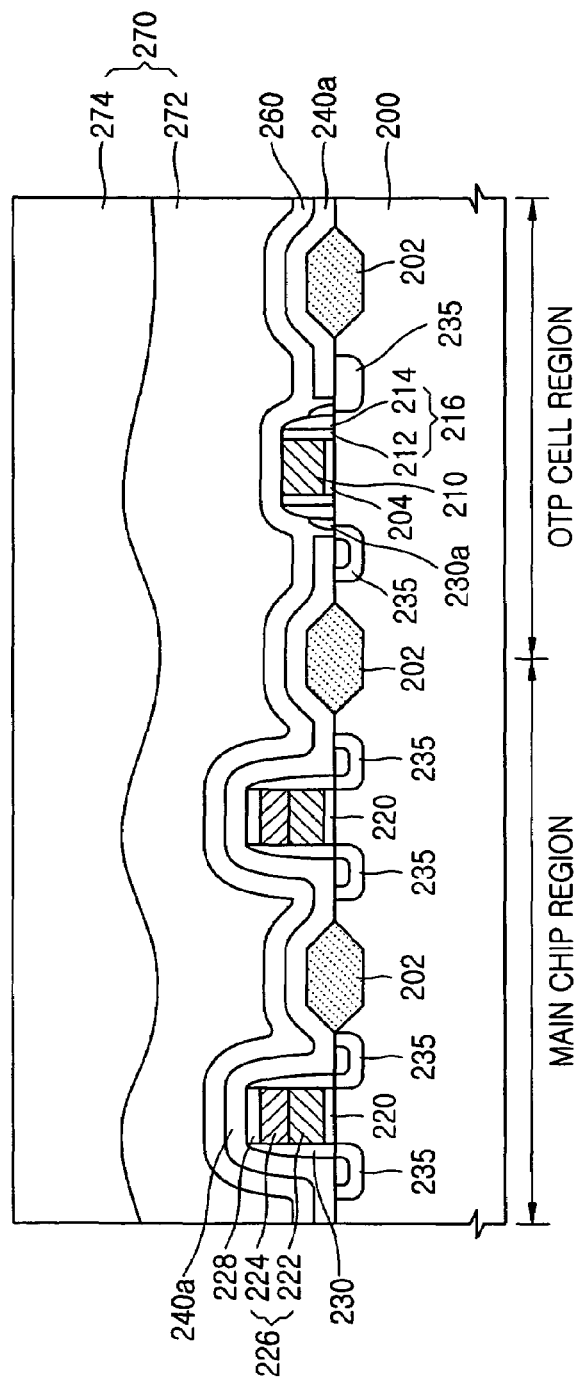

Referring to FIG. 13, a planarized interlayer insulating film 270 is formed on the PEOX film 260. To form the planarized interlayer insulating film 270, a first insulating film 272 and a second insulating film 274 are sequentially formed on the PEOX film 260. Then, an upper surface of the second insulating film 274 is flattened by a CMP process. The flattened interlayer insulating film 270 can be formed in the same configuration as the interlayer insulating film 130 as described in FIG. 4.

According to preferred embodiments of the present invention, the PEOX film formed on the floating gate 210, which constitutes an OTP cell transistor 260, after removing the SiON film 240 to prevent adverse effects to the data retention characteristic, improves the data retention characteristic in a cell transistor by preventing the leakage of the charged electrons from the floating gate 210, while, the SiON film pattern 240a remaining on the gate 226 in the main chip region assures the HCl characteristic and insulating characteristic required for forming the transistor.

Figure 14:
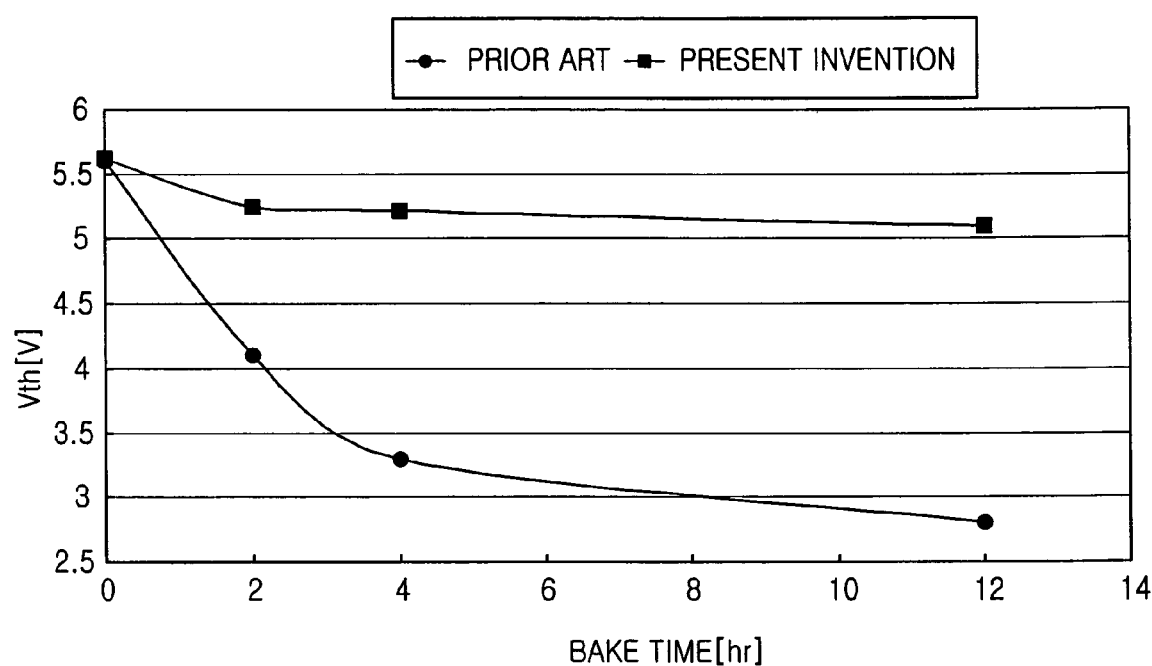
FIG. 14 is a graph showing test results of the variations of a program threshold voltage according to a bake time.

FIG. 14 is a graph showing test results of the variations of a program threshold voltage according to a bake time of a single poly OTP cell constituting an EPROM device according to the present invention in comparison with that of the prior art.

A single poly OTP cell transistor in which an upper face of a floating gate is covered by a PEOX film having a thickness of 600 Å according to the present invention is prepared for verifying the data retention characteristic of the OTP cell. Also, as a comparative example, a single poly OTP cell in which an upper face of a floating gate is covered by a SiON film having a thickness of 600 Å according to the prior art is prepared. Each cell was programmed by applying a 12.5V gate voltage and a 6.0V drain voltage, respectively. Afterward, the leaking degrees of the charged electrons from the floating gate were measured under a forced baking temperature of 250° C.

Referring to FIG. 14, the program threshold voltage of the OTP cell according to the present invention converges to a saturation region as the baking time increases, proving that the data retention characteristic of the OTP cell according to the present invention is improved in comparison to that of the prior art.

In an OTP cell transistor according to the present invention, leaking of the charged electrons from a floating gate which constitutes a transistor can be prevented by forming a PEOX film on the floating gate instead of a SiON film, which has an adverse effect on the data retention characteristic of the OTP cell. Therefore, the data retention characteristic of the single poly OTP cell is improved. Also, in the main chip region, the HCl characteristic and insulating characteristic of a transistor are secured by forming a SiON film on a gate, which constitutes a transistor.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
    a semiconductor substrate having a one time programmable (OTP) cell region and a main chip region;
    a floating gate of an OTP cell transistor in the OTP cell region formed on a first gate insulating film;

first insulating spacers that cover sidewalls of the floating gate;

a gate of a transistor in the main chip region on the substrate formed on a second gate insulating film;

second insulating spacers that cover sidewalls of the gate;

a plasma enhanced oxide (PEOX) film that covers the floating gate and the first insulating spacers in a close state and covers the gate and the second insulating spacers by a predetermined distance, wherein the PEOX film has a thickness in a range of 500~1,000 Å; and a silicon oxy nitride (SiON) film interposed between the gate and the PEOX film in the main chip region.

2. The semiconductor device of claim 1, wherein the floating gate formed in the OTP cell region is a single layer formed of doped polysilicon, and the gate formed in the main chip region is sequentially stacked with a poi silicon film and a metal silicide film.

3. The semiconductor device of claim 1, wherein the SiON film has a thickness in a range of 500~1,000 Å.

4. The semiconductor device of claim 1, wherein the first insulating spacers and the second insulating spacers have different structures.

5. The semiconductor device of claim 4, wherein the first insulating spacers are formed of a combination of a nitride film and an oxide film, and the second insulating spacers are formed of an oxide film.

6. The semiconductor device of claim 1, wherein the main chip region includes one of a high voltage (HV) device region and a low voltage (LV) device region.

7. A semiconductor device comprising:

a semiconductor substrate having a one time programmable (OTP) cell region and a main chip region;

a floating gate of an OTP cell transistor in the OTP cell region formed on a first gate insulating film;

first insulating spacers that cover sidewalls of the floating gate;

a gate of a transistor in the main chip region on the substrate formed on a second gate insulating film;

second insulating spacers that cover sidewalls of the gate;

a plasma enhanced oxide (PEOX) film that covers the floating gate and the first insulating spacers in a close state and covers the gate and the second insulating spacers by a predetermined distance; and a silicon oxy nitride (SiON) film interposed between the gate and the PEOX film in the main chip region, wherein the SiON film has a thickness in a range of 500~1,000 Å.

* * * * *